(12) United States Patent
Liu et al.

(10) Patent No.: US 8,969,135 B2
(45) Date of Patent: Mar. 3, 2015

(54) SEMICONDUCTOR DEVICE AND METHOD OF ASSEMBLING SAME

(71) Applicants: Peng Liu, Tianjin (CN); Qingchun He, Tianjin (CN); Zhaobin Qi, Tianjin (CN); Liqiang Xu, Tianjin (CN); Tong Zhao, Tianjin (CN)

(72) Inventors: Peng Liu, Tianjin (CN); Qingchun He, Tianjin (CN); Zhaobin Qi, Tianjin (CN); Liqiang Xu, Tianjin (CN); Tong Zhao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/077,174

(22) Filed: Nov. 11, 2013

(65) Prior Publication Data
US 2014/0246767 A1 Sep. 4, 2014

(30) Foreign Application Priority Data
Jan. 28, 2013 (CN) .......................... 2013 1 0078670

(51) Int. Cl.
| | | |
|---|---|---|
| *H01L 21/44* | (2006.01) | |
| *H01L 21/48* | (2006.01) | |
| *H01L 21/50* | (2006.01) | |
| *H01L 23/495* | (2006.01) | |
| *H01L 25/00* | (2006.01) | |

(52) U.S. Cl.
CPC .......... *H01L 23/49575* (2013.01); *H01L 25/50* (2013.01); *H01L 2924/0002* (2013.01); *H01L 23/49503* (2013.01); *H01L 23/4952* (2013.01)
USPC ........... 438/106; 438/123; 438/461; 257/666; 257/E21.006; 257/E21.499; 257/E21.506; 257/E21.508; 257/E21.513

(58) Field of Classification Search
USPC ................. 438/106, 111, 118, 122, 123, 461; 257/666, E21.006, E21.499, E21.506, 257/E21.508, E21.513
See application file for complete search history.

(56) References Cited

U.S. PATENT DOCUMENTS

| | | | | |
|---|---|---|---|---|
| 5,227,663 | A * | 7/1993 | Patil et al. ...................... | 257/718 |
| 5,239,131 | A | 8/1993 | Hoffman | |
| 6,549,413 | B2 * | 4/2003 | Karnezos et al. .............. | 361/704 |
| 6,661,083 | B2 * | 12/2003 | Lee et al. ........................ | 257/676 |
| 6,759,307 | B1 * | 7/2004 | Yang .............................. | 438/455 |
| 6,955,941 | B2 * | 10/2005 | Bolken ........................... | 438/106 |
| 7,078,264 | B2 * | 7/2006 | Yang .............................. | 438/108 |
| 7,224,070 | B2 * | 5/2007 | Yang .............................. | 257/777 |
| 7,289,326 | B2 | 10/2007 | Heydari et al. | |
| 7,414,310 | B2 * | 8/2008 | Do et al. ........................ | 257/710 |
| 8,633,059 | B2 * | 1/2014 | Do et al. ........................ | 438/109 |

* cited by examiner

*Primary Examiner* — David Nhu
(74) *Attorney, Agent, or Firm* — Charles Bergere

(57) ABSTRACT

A semiconductor device includes a lead frame having a down bond area, a die attach area and a dam formed between the down bond area and the die attach area. A bottom of the dam is attached on a surface of the lead frame. The dam prevents contamination of the down bond area from die attach material, which may occur during a die attach process.

13 Claims, 4 Drawing Sheets

SEMICONDUCTOR DEVICE AND METHOD OF ASSEMBLING SAME

BACKGROUND OF THE INVENTION

The present invention relates to integrated circuit (IC) device assembly and, more particularly, to lead frames for semiconductor packages.

Many current semiconductor assembly processes include a down bonding process in which a die is electrically connected to a down bond area of a lead frame with a bond wire. However, before the down bonding process, the down bond area of the lead frame may have been contaminated by die attach material such as solder from a die attach process.

FIG. 1 shows a partially assembled semiconductor device 10 having a die 12 attached on a die attach area 14 of a lead frame 16, where the die attach process caused contamination 18 on a down bond area 20 of the lead frame 16. A bond wire 22 electrically connects the die 12 to the down bond area 20 of the lead frame 16. Such contamination 18 on the down bond area 20 can cause the wire bond to have a low wire peel strength.

One solution to prevent contamination of the down bond area 20 is to half etch a groove between the down bond area 20 and the die attach area 14 to prevent the die attach material from leaking into the down bond area 20. However, for devices that have a small lead frame and a large die, there may not be sufficient space for groove formation. Furthermore, the half etching process can be expensive. Accordingly, it would be advantageous to find a new way to prevent contamination of the down bond area from die attach material.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
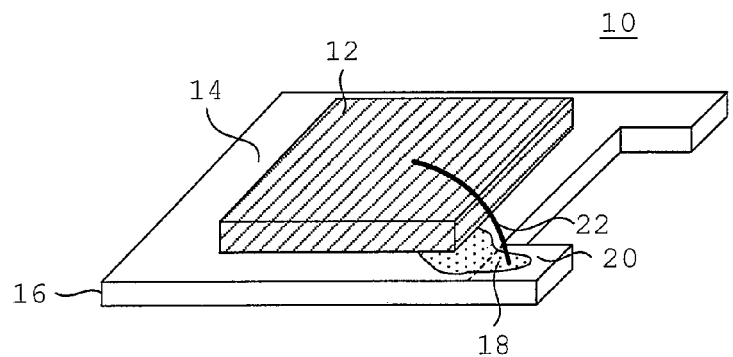
FIG. 1 is an isometric view of a partially assembled conventional semiconductor device showing contamination in the down bond area is contaminated by die attach material.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a semiconductor device including a lead frame having a down bond area and a die attach area, and a dam formed between the down bond area and the die attach area. A bottom of the dam is attached on a surface of the lead frame. The dam prevents contamination of the down bond area from die attach material.

In another embodiment, the present invention provides a method for packaging a semiconductor device including the step of forming a dam between a down bond area and a die attach area on a lead frame. A bottom of the dam is attached on a surface of the lead frame. The dam prevents contamination of the down bond area from die attach material.

Figure 2:
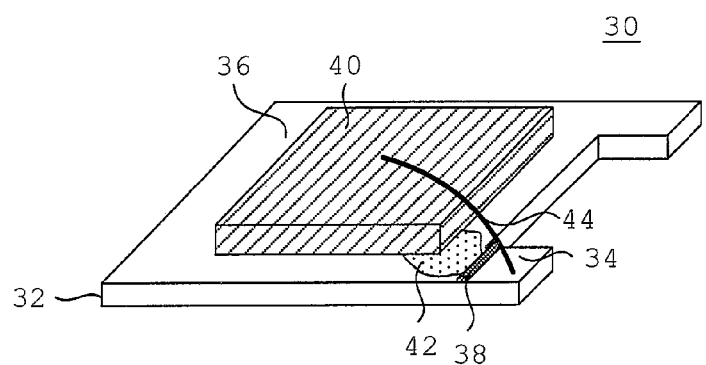
FIG. 2 is an isometric view of a partially assembled semiconductor device with a dam formed between a down bond area and a die attach area on a lead frame in accordance with an embodiment of the present invention.

Referring now to FIG. 2, a partially assembled semiconductor device 30 of the present invention is shown. The semiconductor device 30 includes a lead frame 32 having a down bond area 34, a die attach area 36 and a dam 38 formed between the down bond area 34 and the die attach area 36. A bottom of the dam 38 is attached on a surface of the lead frame 32. When attaching a die 40 to the die attach area 36 of the lead frame 32, the dam 38 prevents contamination of the down bond area 34 from die attach material 42. Therefore, the electrical connection between the die 40 and the down bond area 34 with a bond wire 44 will be less likely to experience low wire peel issues. As previously discussed with reference to FIG. 1, the down bond area 20 of the lead frame 16 may be contaminated by die attach material such as the solvent of solder caused during the die attach process. In a preferred embodiment of the invention, the dam 38 is attached seamlessly on the surface of the lead frame 32. In a preferred embodiment, the dam 38 is formed with a wire made from at least one of Al, Au, or Cu and attached to the surface of the lead frame 32 with a wedge bonding apparatus. In a preferred embodiment, the dam comprises a series of adjoining wedge or stitch bonds. In another preferred embodiment, the dam 38 is formed with cured adhesive paste.

Figure 3:
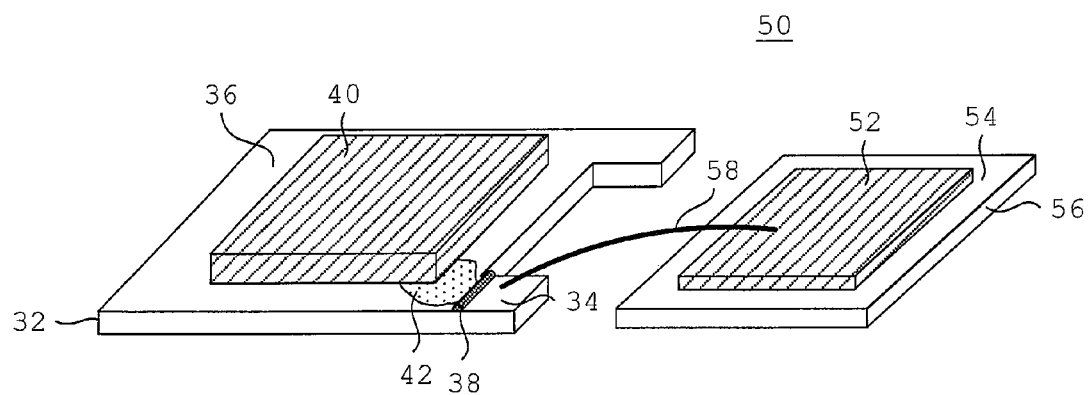
FIG. 3 is an isometric view of a semiconductor device with a dam formed between a down bond area and a die attach area on a lead frame in accordance with another embodiment of the present invention.

Referring to FIG. 3, a partially assembled view of another semiconductor device 50 is shown. The partially assembled semiconductor device 50 includes the lead frame 32 having the down bond area 34, the die attach area 36 and the dam 38 formed between the down bond area 34 and the die attach area 36. The bottom of the dam 38 is attached on a surface of the lead frame 32. The die 40 is attached to the die attach area 36 of the lead frame 32. The dam 38 prevents contamination of the down bond area 34 from die attach material 42. The semiconductor device 50 also includes a second die 52 attached on a second die attach area 54 of a second lead frame 56. The second die 52 is electrically connected to the down bond area 34 with a bond wire 58. The dam 38 prevents contamination of the down bond area 34 and thus the wire bond connection at the down bond area 34 is less likely to experience low wire peel issues. As previously discussed in FIG. 1, the down bond area 20 of the lead frame 16 is may be contaminated by die attach material such as the solvent of solder during the die attach process. In a preferred embodiment of the invention, the dam 38 is attached seamlessly on the surface of the lead frame 32. In a preferred embodiment, the dam 38 is formed with a wire made from at least one of Al, Au, or Cu and attached to the surface of the lead frame using a wire bonding apparatus. In another preferred embodiment, the dam 38 is formed with cured adhesive paste.

FIGS. 4A, 4B, 4C and 4D are a series of diagrams illustrating the steps in packaging a semiconductor device in accordance with an embodiment of the present invention. Starting from FIG. 4A, a dam 38 is formed between a down bond area 34 and a die attach area 36 of a lead frame 32 by attaching a bottom of the dam 38 on a surface of the lead frame 32. As previously discussed with reference to FIG. 1, the down bond area 20 of the lead frame 16 may be contaminated by die attach material such as die attach adhesive or solder caused during the die attach process. In a preferred embodiment of the invention, the dam 38 is attached seamlessly on the surface of the lead frame 32. In a preferred embodiment, the dam 38 is formed with a wire made from at least one of Al, Au, or Cu and attached to the surface of the lead frame 32 with a wedge bonding apparatus. In another preferred embodiment, the dam 38 is formed with cured adhesive paste.

Figure 4A:
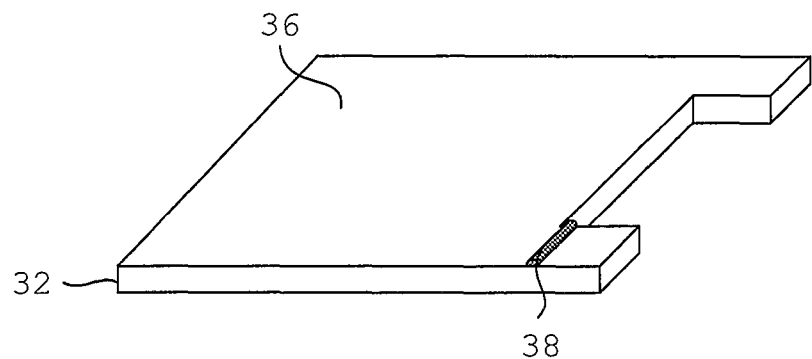
FIGS. 4A, 4B, 4C and 4D are a series of diagrams illustrating the steps in packaging a semiconductor device in accordance with an embodiment of the present invention.
Figure 4B:
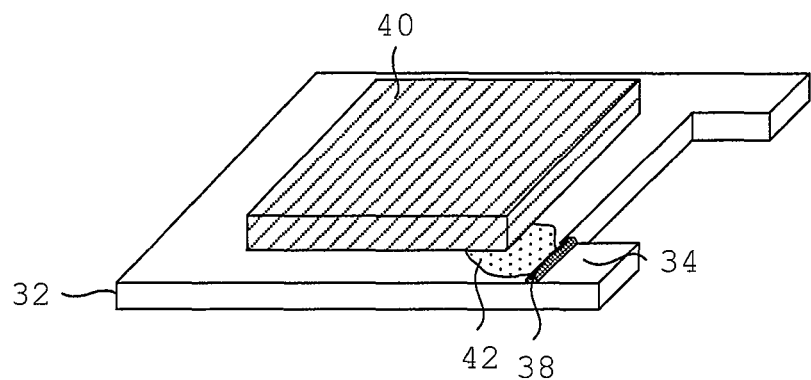

In the next step illustrated in FIG. 4B, a die 40 is attached on the die attach area 36 of the lead frame 32, which may cause contamination on the surface of the lead frame 32 by die attach material 42. However, as shown in FIG. 4B, the dam 38 prevents contamination of the down bond area 34 from die attach material 42.

Figure 4C:
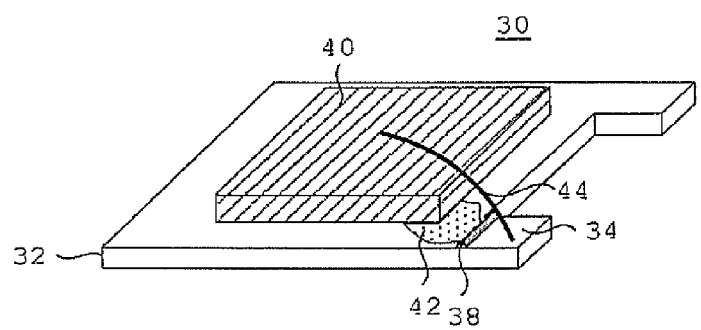
Figure 4D:
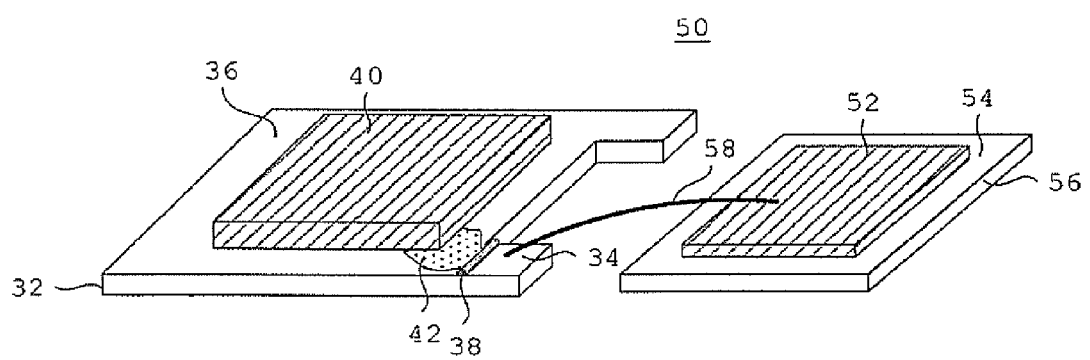

In the next step illustrated in FIG. 4C, the die 40 is electrically connected to the down bond area 34 with a bond wire 44. The electrical connection between the die 40 and the down bond area 34 with the bond wire 44 will be less likely to experience low wire peel issues because the dam 38 prevents contamination of the down bond area 34 with die attach material 42. In another embodiment as shown in FIG. 4D, a second die 52 attached on a second die attach area 54 of a second lead frame 56 is electrically connected to the down bond area 34 with a bond wire 58.

Figure 5A:
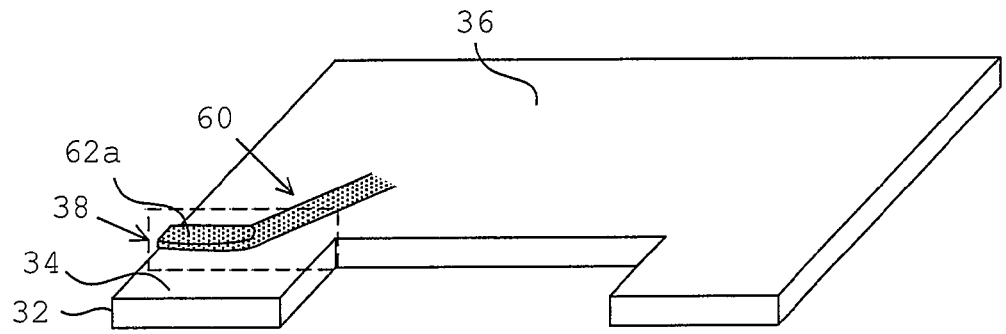
FIGS. 5A-5C are a series of diagrams illustrating the steps in forming a dam in accordance with an embodiment of the present invention.
Figure 5B:
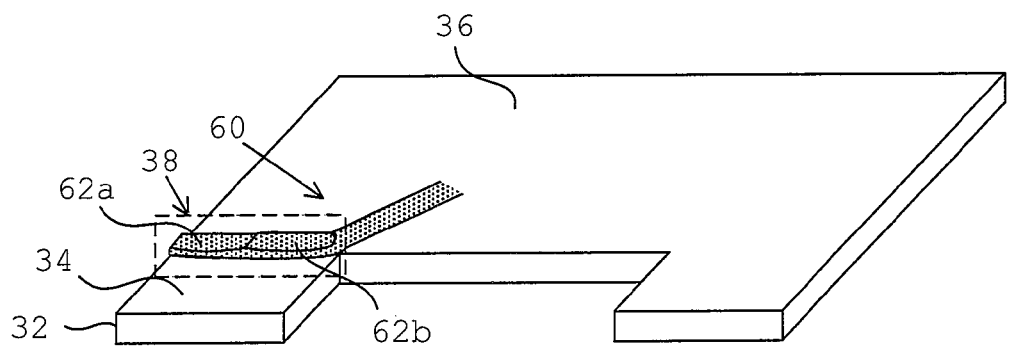
Figure 5C:
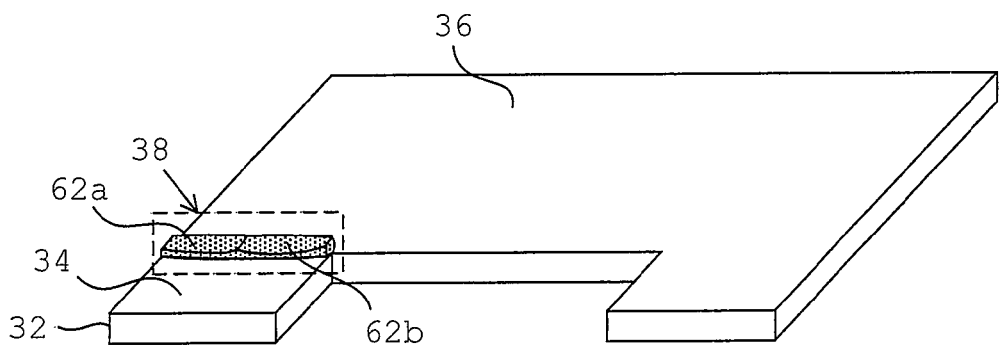

FIGS. 5A-C are a series of diagrams illustrating the steps in forming a dam in accordance with an embodiment of the present invention. Starting from FIG. 5A, one end of a wire 60 is attached on the surface of the lead frame 32 with a wedge bonding apparatus, which forms a first stitch bond 62a as a part of a dam 38 between a down bond area 34 and a die attach area 36. In a preferred embodiment, the length of the stitch bond 62a ranges from about 0.5 mm to about 0.6 mm.

In the next step as illustrated in FIG. 5B, a second stitch bond 62b is formed adjacent to and abutting the first stitch bond 62a as another part of the dam 38 with the wedge bonding apparatus. In a preferred embodiment, the first and second stitch bonds 62a and 62b at least partially overlap. The stitch bonds 62a, 62b are formed continuously until the length of the dam 38 is long enough to prevent contamination of the down bond area 34 from die attach material. In a preferred embodiment, a dam 38 with a length of about 1.0 mm is sufficient to prevent contamination of the down bond area 34 from die attach material. Therefore, the dam 38 can be formed with two stitch bonds.

In the next step illustrated in FIG. 5C, the formation of the dam 38 is completed by breaking the wire 60 after formation of the second stitch bond 62b.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor device, comprising:
    a lead frame having a down bond area and a die attach area; and
    a dam formed between the down bond area and the die attach area, wherein a bottom of the dam is attached on a surface of the lead frame, and wherein the dam prevents contamination of the down bond area from die attach material, wherein the dam comprises a wire having a series of abutting stitch bonds.

2. The semiconductor device of claim 1, further comprising:
    a first die attached on the die attach area; and
    a bond wire electrically connecting the first die to the down bond area.

3. The semiconductor device of claim 1, further comprising:
    a first die attached on the die attach area;
    a second lead frame having a second die attach area;
    a second die attached to the second die attach area; and
    a bond wire electrically connecting the second die to the down bond area.

4. The semiconductor device of claim 1, wherein the dam is attached seamlessly on the surface of the lead frame.

5. The semiconductor device of claim 1, wherein the wire is one of an Al, Cu and Au wire.

6. The semiconductor device of claim 1, wherein the wire is attached to the surface of the first lead frame with a wedge bonding apparatus.

7. The semiconductor device of claim 1, wherein adjacent stitch bonds at least partially overlap.

8. A method for packaging a semiconductor device, the method comprising:
    providing a lead frame having a die attach area and a down bond area; and
    forming a dam between a down bond area and a die attach area of the lead frame, wherein a bottom of the dam is attached on a surface of the lead frame, and wherein the dam prevents contamination of the down bond area from die attach material, wherein the dam is a wire that is attached to the surface of the lead frame with a stitch bonding process.

9. The method of claim 8, further comprising:
    attaching a first die on the die attach area; and
    electrically connecting the first die to the down bond area with a bond wire.

10. The method of claim 8, further comprising:
    attaching a first die on the die attach area; and
    electrically connecting a second die attached on a second die attach area of a second lead frame to the down bond area with a bond wire.

11. The method of claim 8, wherein the dam is attached seamlessly on the surface of the first lead frame.

12. The method of claim 8, wherein the wire is one of an Al, Cu and Au wire.

13. The method of claim 8, wherein the wire is attached to the surface of the first lead frame with a wedge bonding apparatus.

* * * * *